United States Patent
Min et al.

(10) Patent No.: US 8,203,164 B2
(45) Date of Patent: Jun. 19, 2012

(54) LIGHT EMITTING DIODE PACKAGE

(75) Inventors: Bong Girl Min, Gyunggi-do (KR); Je Myung Park, Gyunggi-do (KR); Kyung Tae Kim, Hwasung (KR)

(73) Assignee: Samsung LED Co., Ltd., Gyunggi-Do (KR)

( * ) Notice: Subject to any disclaimer, the term of this patent is extended or adjusted under 35 U.S.C. 154(b) by 529 days.

(21) Appl. No.: 12/071,321

(22) Filed: Feb. 20, 2008

(65) Prior Publication Data

US 2008/0224162 A1      Sep. 18, 2008

(30) Foreign Application Priority Data

Mar. 14, 2007   (KR) .................. 10-2007-0025170

(51) Int. Cl.
*H01L 33/00* (2010.01)

(52) U.S. Cl. ............... 257/99; 257/98; 257/100

(58) Field of Classification Search ............. 257/98, 257/99, 100
See application file for complete search history.

(56) References Cited

U.S. PATENT DOCUMENTS

| 5,998,925 | A  | * | 12/1999 | Shimizu et al. | ............ 313/503 |
| 6,245,259 | B1 | * | 6/2001  | Hohn et al.    | ............ 252/301.36 |
| 6,642,652 | B2 |   | 11/2003 | Collins, III et al. | |
| 7,045,956 | B2 | * | 5/2006  | Braune et al.  | ............ 313/512 |
| 7,749,038 | B2 | * | 7/2010  | Cheng et al.   | ............ 445/24 |

| 2006/0043407 | A1 |   | 3/2006  | Okazaki |
| 2006/0076571 | A1 | * | 4/2006  | Hsieh et al. ............ 257/99 |
| 2006/0261360 | A1 | * | 11/2006 | Takehashi et al. ............ 257/98 |
| 2007/0019416 | A1 |   | 1/2007  | Han et al. |
| 2007/0030703 | A1 |   | 2/2007  | Lee et al. |
| 2007/0278510 | A1 |   | 12/2007 | Sakuma et al. |

FOREIGN PATENT DOCUMENTS

| JP | 2004-039691 A | 2/2004 |
| JP | 2005-033194   | 2/2005 |

(Continued)

OTHER PUBLICATIONS

Machine Translation of KR 10-0632003.*

(Continued)

*Primary Examiner* — Anthony Ho
(74) *Attorney, Agent, or Firm* — McDermott Will & Emery LLP

(57) ABSTRACT

A light emitting diode (LED) package including: an LED chip; a first lead frame having a heat transfer unit with a top where a groove for stably mounting the LED chip is formed; a second lead frame disposed separately from the first lead frame; a package body having a concave portion encapsulating a portion of the heat transfer unit and the second lead frame but exposing a portion of the top of the heat transfer unit and a portion of the lead frame, and a ring-shaped portion extended in a ring shape along an inner wall of the groove of the heat transfer unit and forming an aperture in a center thereof; and a phosphor layer formed on the aperture of the ring-shaped portion and applied to the LED chip, wherein the LED chip is disposed in the inside of the aperture of the ring-shape portion.

17 Claims, 17 Drawing Sheets

FOREIGN PATENT DOCUMENTS

| | | |
|---|---|---|
| JP | 2006-93672 A | 4/2006 |
| JP | 2006-108238 A | 4/2006 |
| JP | 2006-156662 A | 6/2006 |
| JP | 2007-027765 | 2/2007 |
| JP | 2007-049149 | 2/2007 |
| KR | 10-0632003 | 9/2006 |
| WO | WO 2005/090517 A1 | 9/2005 |

OTHER PUBLICATIONS

Japanese Office Action, with English translation, issued in Japanese Patent Application No. 2008-038854, mailed Jan. 11, 2011.

Japanese Decision of Rejection, w/ English translation thereof, issued in Japanese Patent Application No. 2008-038854, dated Dec. 20, 2011.

* cited by examiner

LIGHT EMITTING DIODE PACKAGE

CROSS-REFERENCE TO RELATED APPLICATIONS

This application claims the priority of Korean Patent Application No. 2007-0025170 filed on Mar. 14, 2007, in the Korean Intellectual Property Office, the disclosure of which is incorporated herein by reference.

BACKGROUND OF THE INVENTION

1. Field of the Invention

The present invention relates to a light emitting diode (LED) package, and more particularly, to an LED package not only having an excellent thermal emission properties and high durability but also with a small light loss and improved color uniformity.

2. Description of the Related Art

Recently, light emitting diodes (LEDs) are generally used as a light source for lighting or a light source for a backlight unit for a liquid crystal display (LCD). Generally, an LED package such as a white LED device outputs light of a desired mixed color by converting a wavelength of light emitted from an LED chip by using phosphors disposed outside the LED chip. For example, a white LED package manufactured by applying yellow phosphors on a blue LED chip emits a white light by mixing a blue light and a yellow light obtained by converting by the phosphors.

Since an LED package used for a light device or a large LCD device requires a white light or another mixed color light, with a great output and high quality, a package structure having an excellent thermal emission function and high color uniformity according to a far-field beam distribution is required. Also, to improve efficiency of an LED package, it is required to reduce a light loss due to light incapable of being emitted outside and returning to phosphors and a chip to be absorbed or distinguished.

FIGS. 1A to 1C are cross-sectional views illustrating conventional LED packages.

Referring to FIG. 1A, an LED package 10 includes lead frames 12a and 12b inserted therein, a package body 11 having areflective cup 11a, and an LED chip 15 mounted on the reflective cup 11a. A resin encapsulation portion 18 encapsulates the LED chip 15 in the reflective cup 11a. In the resin encapsulation portion 18, phosphors including a mixture of phosphors for converting a color are scattered.

According to the LED package of FIG. 1A, color is non-uniform according to a far-field beam distribution due to a difference between a color conversion rate of a beam vertically emitted from a top surface of the LED chip 15 caused by the phosphors and that of a beam emitted from a side of the LED chip 15 caused by the phosphors. Accordingly, entire color uniformity becomes low and quality of an output light such as lighting quality is deteriorated. To obtain uniform color, an additional color mixing element may be mounted. However, this becomes a cause of increasing manufacturing costs. Also, since an insulating body is used for the package body 11 and there is no additional heat slug structure, thermal emission properties required in a high power LED is bad.

FIG. 1B illustrates a conventional package structure provided to improve color uniformity of an output light. Referring to FIG. 1B, an LED package 20 includes a package board 24, an LED chip 25 mounted on the board 24, a resin encapsulation element 28 encapsulating the LED chip 25. A phosphor layer 26 is disposed with a certain distance from the LED chip 25. Since color is converted by the phosphor layer 26, uniformity of emitted color may be improved. However, it is difficult to stably form a phosphor layer having the structure, and a process of manufacturing the LED package is complicate. Also, due to a low reproducibility of the manufacturing process, there are shown different light output characteristics for each product. Accordingly, due to great manufacturing dispersion, it is difficult to actually apply.

An LED package 30 of FIG. 1C includes an LED chip 35 mounted on a reflective cup and a phosphor 36 disposed around the LED chip 35, which is capable of improving color uniformity. Through the phosphor layer 36 with a certain thickness, formed on a top surface and side surfaces of the LED chip 35, color uniformity of light outputted from an encapsulation element 38 is capable of being improved. However, there is a great loss of light reflected by the phosphor layer 36. In detail, since there are five surfaces where the phosphor layer 36 is in contact with the encapsulation element 38, that is, a top surface and four side surfaces, a considerable part of light emitted from the LED chip 35, which is incapable of being out of the package 30 and is reflected to the LED chip 35, is scattered inside the phosphor layer 35 and distinguished, thereby causing a light loss of the package 30. Also, to obtain a structure of the package 30, a phosphor layer having a uniform thickness should be formed around an LED chip and it is required to reduce thickness dispersion between products, which requires a complicate manufacturing process and precise manufacturing conditions.

SUMMARY OF THE INVENTION

An aspect of the present invention provides a light emitting diode (LED) package having high color uniformity according to a view angle, less light loss, and excellent thermal emission characteristics.

According to an aspect of the present invention, there is provided an LED package including: an LED chip; a first lead frame having a heat transfer unit with a top where a groove for stably mounting the LED chip is formed; a second lead frame disposed separately from the first lead frame; a package body having a concave portion encapsulating a portion of the heat transfer unit and the second lead frame but exposing a portion of the top of the heat transfer unit and a portion of the lead frame, and a ring-shaped portion extended in a ring shape along an inner wall of the groove of the heat transfer unit and forming an aperture in a center thereof; and a phosphor layer formed on the aperture of the ring-shaped portion and applied to the LED chip, wherein the LED chip is disposed in the inside of the aperture of the ring-shape portion.

The heat transfer unit may be formed by folding a sheet metal two times or more. In this case, the sheet metal with a top may have a hole to form the groove of the heat transfer unit. Also, the top of the folded sheet metal may have a ring-shape since an incised portion connected to the hole is formed thereon.

The heat transfer unit may be formed of a sheet metal lamination body where two or more sheet metals are laminated. In this case, an uppermost sheet metal of the sheet metal lamination body may have a hole to form the groove of the heat transfer unit. The uppermost sheet metal may have a ring shape since an incised portion connected to the hole is formed thereon.

The heat transfer unit may be formed of a single structure of a sheet metal consecutively extended in a thickness direction. In this case, the sheet metal may have different thicknesses in an inner area and an outer area of the groove of the heat transfer unit.

At least a portion of a bottom of the heat transfer unit may be exposed from a bottom of the package body. An inner wall of the ring-shaped portion may be slant in such a way that the aperture has a top broader than a bottom thereof. A height of the aperture of the ring-shaped portion may be 0.1 to 0.7 mm. A horizontal distance between the inner wall of the ring-shaped portion and the LED chip may be from 0.2 to 0.5 mm.

The LED package may further include a light-transmitting encapsulation portion formed in the concave portion of the package body and covering a top surface of the phosphor layer. The light-transmitting encapsulation portion may contain a light diffuser. Also, the light-transmitting encapsulation portion may contain phosphors.

The LED package may further include a lens mounted on the light-transmitting encapsulation portion. The lens may have various forms such as a hemisphere, a dome, and an oval. Also, the light-transmitting encapsulation portion may be formed in the shape of a lens. The top surface of the phosphor layer may have a shape of one of a convex lens and a concave lens.

The LED package may further include a submount mounted on a bottom of groove and having electrode patterns. The LED chip may be mounted on the submount and electrically connected to the electrode patterns. The electrode patterns of the submount may be electrically connected to the lead frame by bonding wires.

A hole for indicating a polarity may be formed on one of external terminals of the first and second lead frames exposed from the package body.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1A:
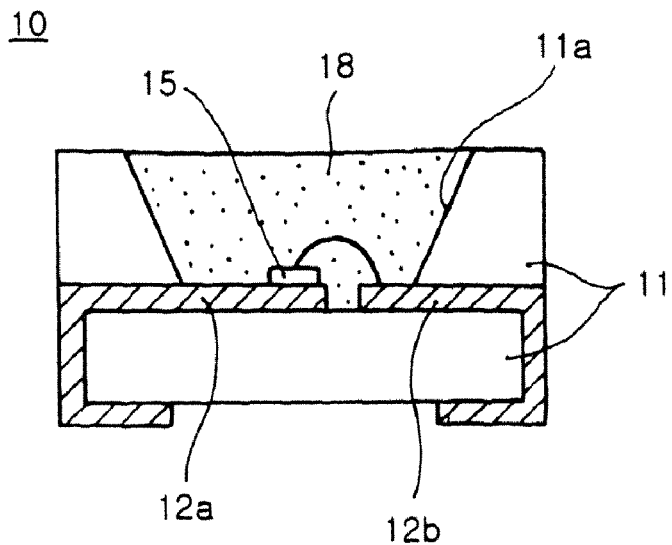
FIGS. 1A to 1C are cross-sectional views illustrating conventional light emitting diode (LED) packages.
Figure 1B:
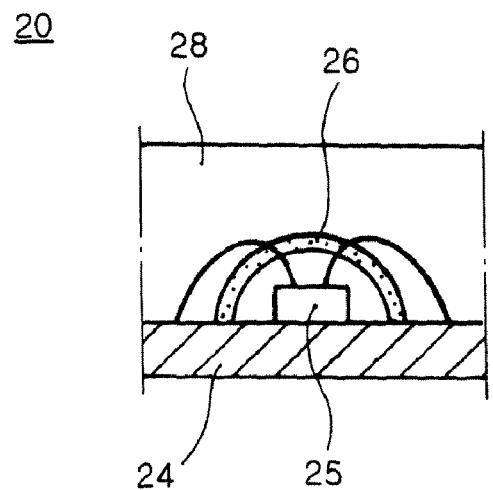

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity.

Figure 2:
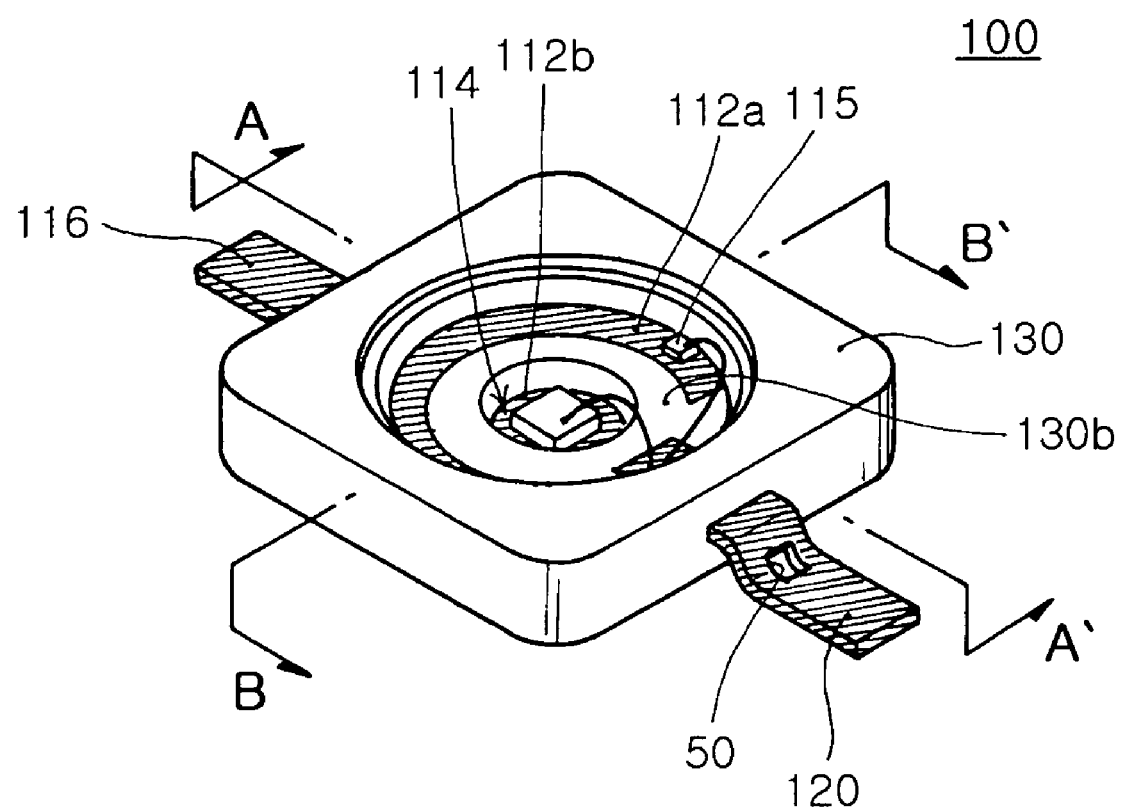
FIG. 2 is a perspective view illustrating an LED package according to an exemplary embodiment of the present invention.
Figure 3:
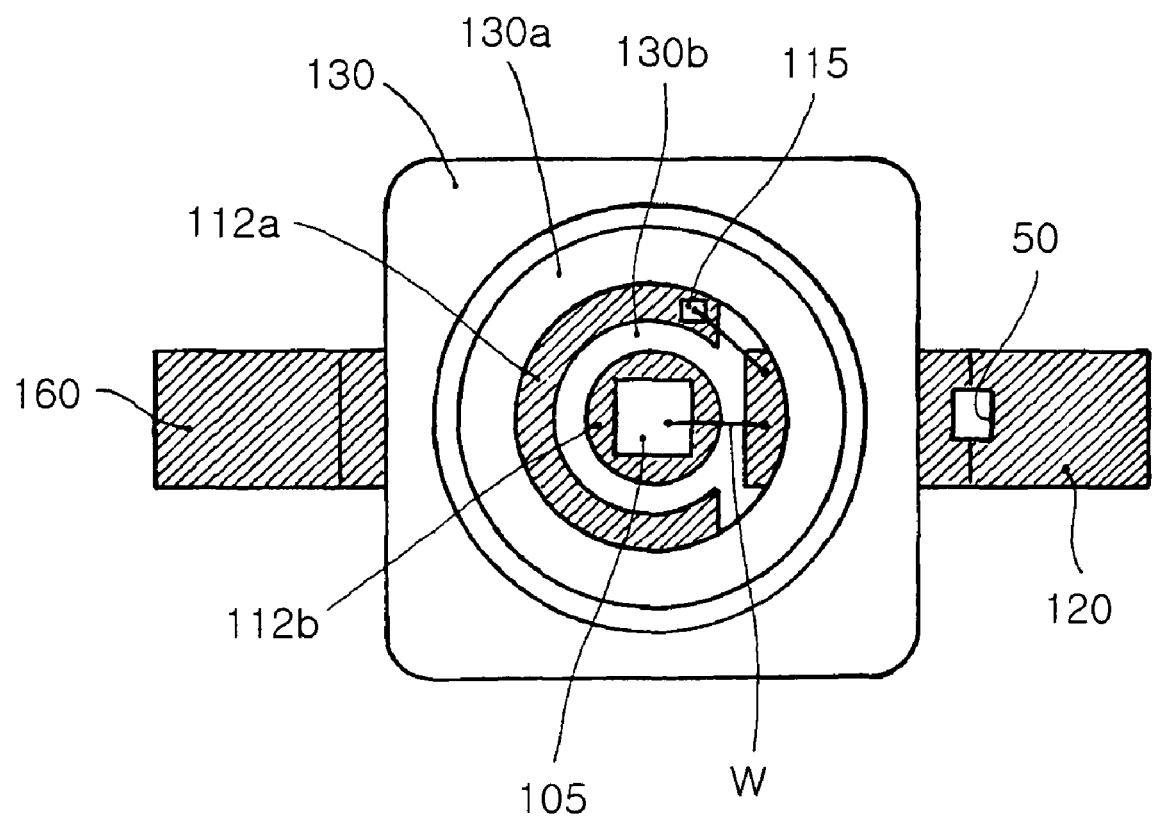
FIG. 3 is a top view illustrating the LED package of FIG. 2.
Figure 4:
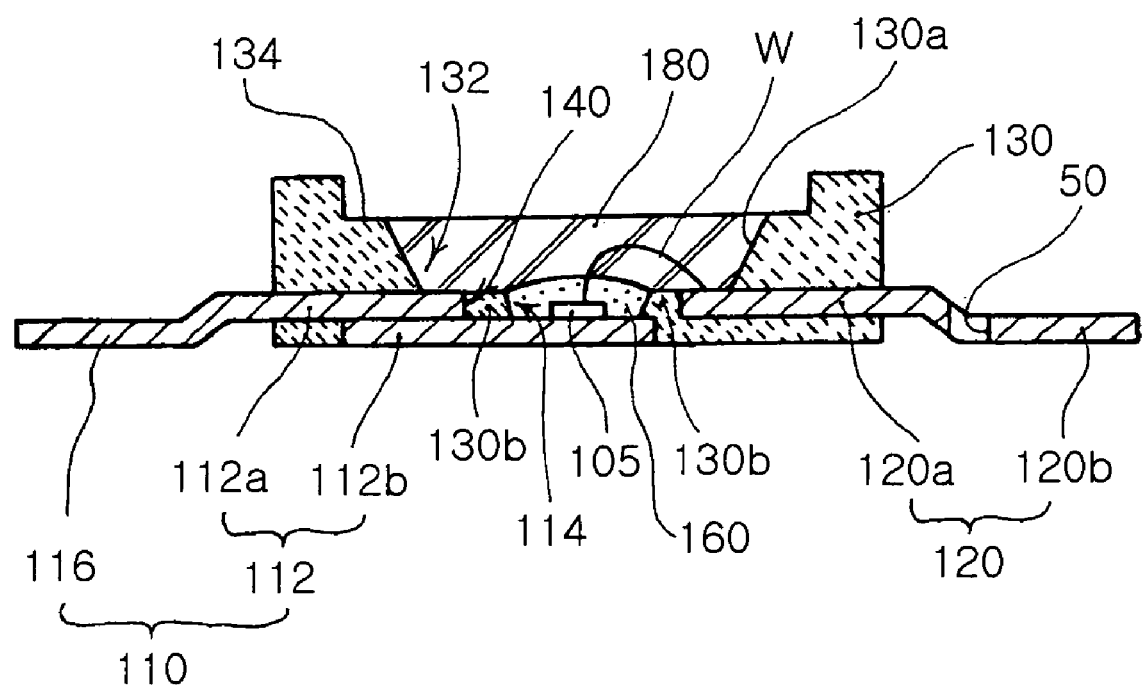
FIG. 4 is a cross-sectional view illustrating the LED package of FIG. 2, cut along a line AA'.
Figure 5:
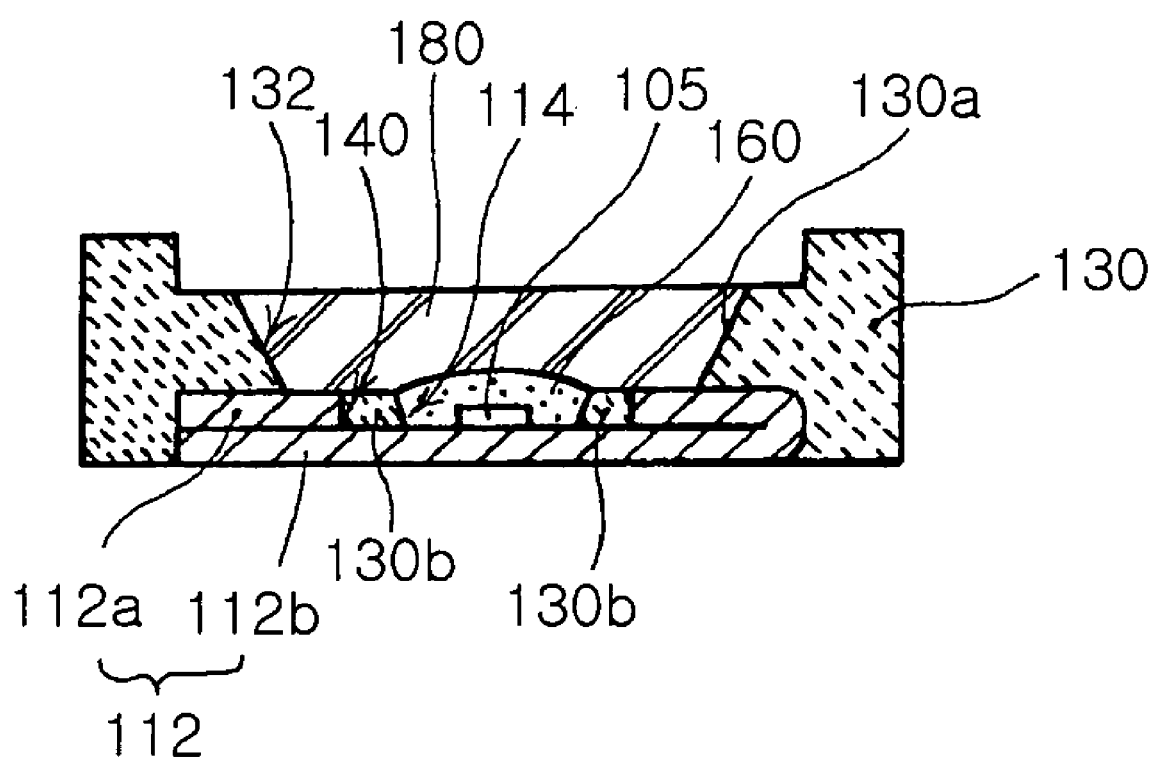
FIG. 5 is a cross-sectional view illustrating the LED package of FIG. 2, cut along a line BB'.
Figure 6:
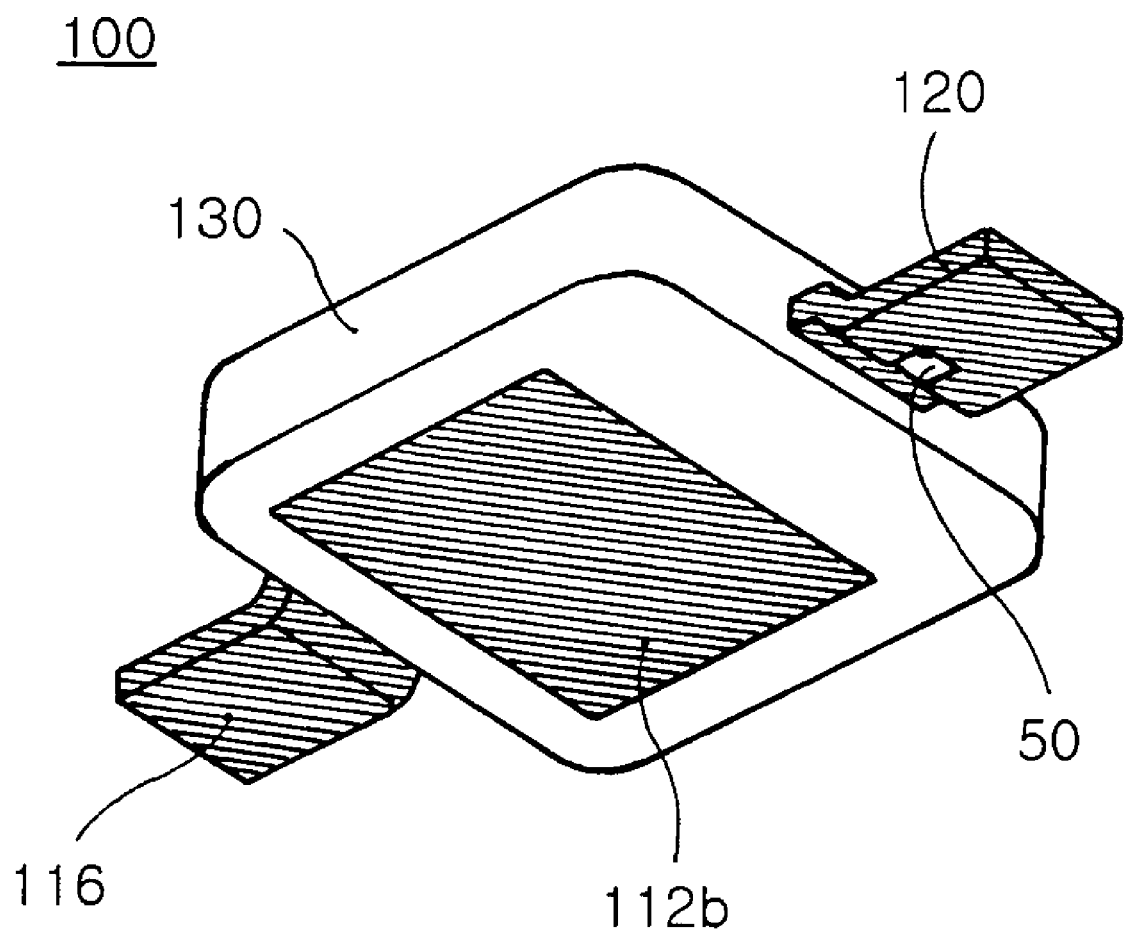
FIG. 6 is a bottom view illustrating the LED package of FIG. 2.

FIG. 2 is a perspective view illustrating a light emitting diode (LED) package 100 according to an exemplary embodiment of the present invention, FIG. 3 is a top view illustrating the LED package 100, FIG. 4 is a cross-sectional view illustrating the LED package 100 cut along a line AA', FIG. 5 is a cross-sectional view illustrating the LED package 100 cut along a line BB', and FIG. 6 is a bottom view illustrating the LED package 100.

The LED package 100 includes first and second lead frames 110 and 120, separately disposed, a package body 130, an LED chip 105, and a phosphor layer 160. The first lead frame 110 has a heat transfer unit 112 in the center of the package body 130. The package body 130 encapsulates portions of the first and second lead frames 110 and 120, that is, the portions of the lead frames 110 and 120 are inserted into the package body 130. The LED chip 105 is mounted on the heat transfer unit 112, and the phosphor layer 160 encapsulates the LED chip 105. The phosphor layer 160 may be, for example, a transparent resin or polymer such as silicone and epoxy, which is filled with phosphors.

The heat transfer unit 112 is formed of a top 112a and a bottom 112b, which forms a step. A groove 140 for stably mounting the LED chip 105 is formed on the top 112a as shown in FIGS. 4 and 5. Via the heat transfer unit 112, heat generated by the LED chip 105 is easily emitted, thereby minimizing a heat transfer path.

As shown in FIG. 5, the heat transfer unit 112 may be formed by folding a sheet metal two or more times. In this case, the top 112a and the bottom 112b formed of the folded sheet metal may be strongly bonded by a binder such as solder or by welding. A portion of the top 112a of the heat transfer unit 112 is extended from the package body 130 to form an external lead terminal 116 of the first lead frame 110. A portion or more of a bottom surface of the bottom 112b of the heat transfer unit 112, as clearly shown in FIG. 6, is exposed outwardly, thereby improving a thermal emission effect by the heat transfer unit 112.

When the heat transfer unit 112 is formed by folding the sheet metal, a hole may be formed on the top 112a to form the groove 140 for stably mounting the LED chip 105. Also, an incised portion 141 connected to the hole may be formed on the top 112a to form the top 112a in a ring shape (refer to FIGS. 3 and 10). As described below, a structure having one of an incised portion and a ring shape allows a ring-shaped portion to be easily formed.

The package body 130 includes a concave portion 132 encapsulating portions of the heat transfer 112 and the second lead frame 120 and exposing the top 112a of the heat transfer unit 112 and another portion of the second lead frame 120. A top of the package body 130 forms a reflective cup 130a by the concave portion 132. An inner wall of the concave portion 132 is inclined in such a way that a top of the concave portion 132 is broader than a bottom thereof, which allows light emitted from light sources such as the LED chip 105 and the phosphor layer 160 to be reflected upward. A step portion 134 may be formed around the outside of the concave portion 132. The step portion 134 may support and guide one of a cover or lens mounted on a light-transmitting encapsulation portion 180 (refer to FIG. 13). The package body 130 supports the lead frame 110 and 120 and may be formed by in insertion molding or injection molding plastic or polymer.

Also, the package body 130 has a ring-shaped portion 130b formed in the groove 140 of the heat transfer unit 112. The ring-shaped portion 130b forms a portion of the package body 130 and is extended in the shape of a ring along an inner wall of the groove of the heat transfer unit 112, where an aperture 114 is formed in the center of the ring-shaped portion 130b. The ring-shaped portion 130b allows the first lead frame 110 including the heat transfer unit 112 and the second lead frame 120 to be more strongly bonded with the package body 130 and restrains a separation between elements such as the lead frames 110 and 120 and the heat transfer unit 112 due to external impacts, thereby increasing mechanical durability of the package body 130.

The LED chip 105 is mounted in the aperture 114 of the ring-shaped portion 120 to be disposed on a bottom of the groove 140 of the heat transfer unit 112, and the phosphor layer 160 is formed on the aperture 114 to coat the LED chip 105. The mounted LED chip 105 may be electrically connected to the lead frames 110 and 120 in many ways. For example, in the present embodiment, a bottom, an electrode, of the LED chip 105 of a vertical type may be electrically connected to the first lead frame 110 by soldering, a top, an electrode, of the LED chip 105 may be electrically connected to the second lead frame 120 by bonding wires W. On the other hand, in the case of the LED chip 105 of a lateral type, an electric connection between the LED chip 105 and the lead frames 110 and 120 may be performed by two bonding wires (refer to FIG. 16).

A certain amount of a resin containing phosphors is dispensed into the aperture 114 of the ring-shaped portion 130b, thereby easily forming the phosphor layer 160 with a relatively uniform thickness to coat the LED chip 105 by the relatively uniform thickness. A height of the ring-shaped portion 130b may be from 0.1 to 0.7 mm from a top surface of the LED chip 105, and a horizontal distance between an inner wall of the ring-shaped portion 130b and the LED chip 105 may be from 0.2 to 0.5 mm. The phosphor layer 160 with a uniform thickness may be easily formed by determining a size of the ring-shaped portion 130b within a range as described above.

Particularly, the inner wall of the ring-shaped portion 130b is inclined in such a way that light incident upon the inner wall of the aperture from the LED chip 105 is easily reflected in an upper direction of the aperture 114. An effect of a reflective cup may be obtained by using the inner wall of the aperture 114 of the ring-shaped portion 130b.

The light-transmitting encapsulation portion 180 is disposed in the concave portion 132 of the package body 130 and covers a top surface of the phosphor layer 160. The light-transmitting encapsulation portion 180 may be formed of a light-transmitting resin or polymer such as a silicone resin and epoxy resin. Since the light-transmitting encapsulation portion 180 contains one of a light scattering material and a light dispersion material, which may allow colors of light emitted from the phosphor layer 160 to be mixed. Also, the light-transmitting encapsulation portion 180 contains phosphors identical to or different from the phosphors in the phosphor layer 160, thereby outputting a desired light. A refractive index or light-transmitting index of the light-transmitting encapsulation portion 180 may be identical to or different from that of the phosphor layer 160.

As shown in FIGS. 2 and 3, to protect the LED chip 105 from a high transient voltage such as an electrostatic voltage, a protective device such as a Zener diode 115 may be disposed in one of the lead frames 110 and 120 and electrically connected to another thereof. In this case, not to shield an emitted light or not to disturb a light emission index, the Zener diode 115 is disposed outside of the aperture 114. Also, to easily distinguish a polarity of the first and second lead frames 110 and 120, a hole or a chamber for indicating a polarity may be formed on one of external terminals 116 and 120b of the first and second lead frames 110 and 120, exposed from the package body 130. In this case, the external terminals 116 and 120b of the lead frames 110 and 120 indicate portions of the lead frames 110 and 120, which are exposed from the package body 130 and connected an external circuit. In FIG. 2, a hole 50 is formed on the external terminal 120b of the second lead frame 120.

According to the present embodiment, due to the heat transfer unit 112 functioning as a heat slug, there are shown excellent heat emission characteristics. The heat transfer unit 112 forms a portion of the first lead frame 110, in which the heat transfer unit 112 is formed in a single structure with the external lead terminal 116, thereby preventing a departure or a separation of the heat transfer unit 112. The lead frames 110 and 120 are more strongly bonded to the package body 130 by the ring-shaped portion 130b, thereby improving durability of the entire package. In addition, the phosphor layer 160 coating the LED chip 105 is disposed in the aperture 114 of the ring-shaped portion 130b, thereby removing color nonuniformity according to a far-field beam distribution and improving the entire color uniformity. Also, across-section of the phosphor layer 160 is formed in a lens profile, in the present embodiment, a profile of a convex lens, thereby adjusting light intensity and far-field beam distribution.

Figure 1C:
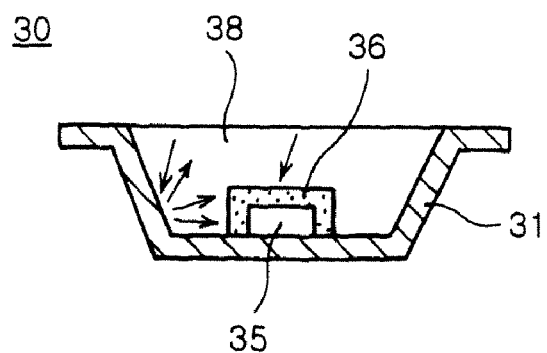
Figure 9:
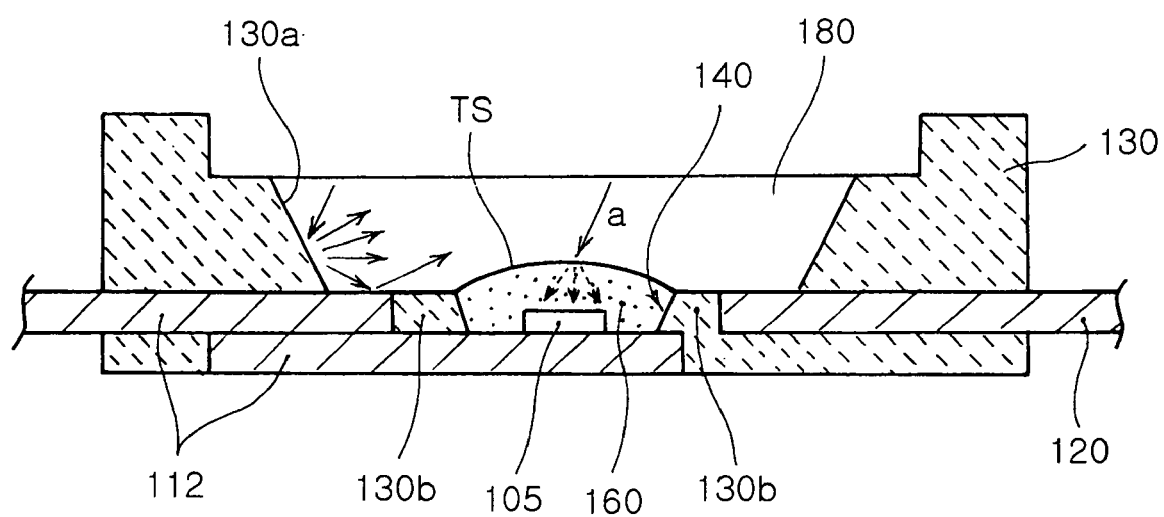
FIG. 9 is a cross-sectional view illustrating a path of reflective light in the LED package of FIG. 2.

Also, according to the present embodiment, an incident area of light reflected toward the LED chip 105 instead of being emitted outwardly is reduced, thereby reducing a loss due to phosphors. Referring to FIG. 9, light reflected toward the LED chip 105 instead of being emitted outwardly from the light-transmitting encapsulation portion 180 passes through the light-transmitting encapsulation portion 180 where a portion thereof is reflected by an inner wall of the reflective cup 130a of the package body 130 to be scattered and another portion thereof is incident on the phosphor layer 160 to be lost. According to the configuration, light incident on the phosphor layer 160 may be incident on the phosphor layer 160 via only one surface such as a top surface (compare with FIG. 1C). Accordingly, the incident area of the light incident on the phosphor layer 160 is reduced, thereby reducing the light loss due to the phosphor layer 160.

Figure 7:
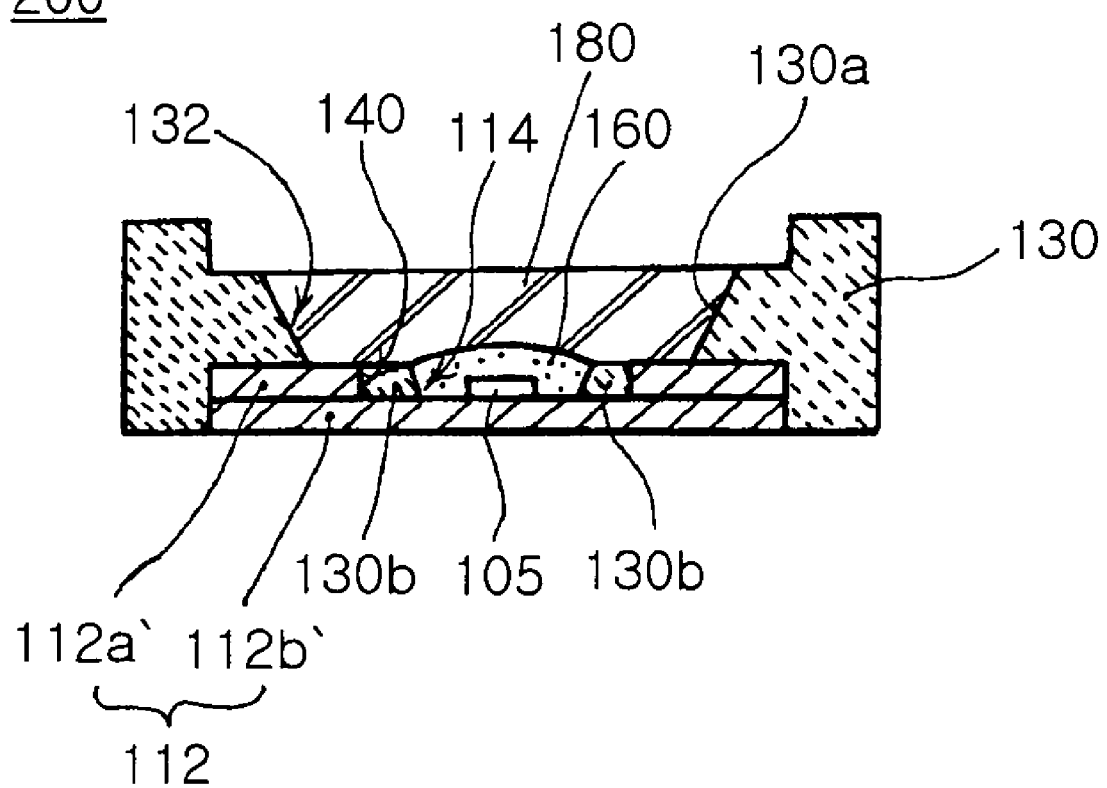
FIG. 7 is a cross-sectional view illustrating an LED package according to another embodiment of the present invention, cut along the line BB'.

FIG. 7 is a cross-sectional view illustrating an LED package according to another embodiment of the present invention, cut along the line BB', which corresponds to FIG. 5. Referring to FIG. 7, the heat transfer unit 112 is formed by laminating two or more separated sheet metals 112a' and 112b', instead of folding the sheet metal. The sheet metals 112a' and 112b' may be bonded by solder or welding. In this case, there may be a hole on an upper most sheet metal 112a' to form the groove 140 of the heat transfer unit 112. Also, an incise portion connected to the hole may be formed on the uppermost sheet metal 112a' to form the uppermost sheet metal 112a' in the shape of a ring (refer to FIG. 10). Other elements and functions thereof are as described above.

Figure 8:
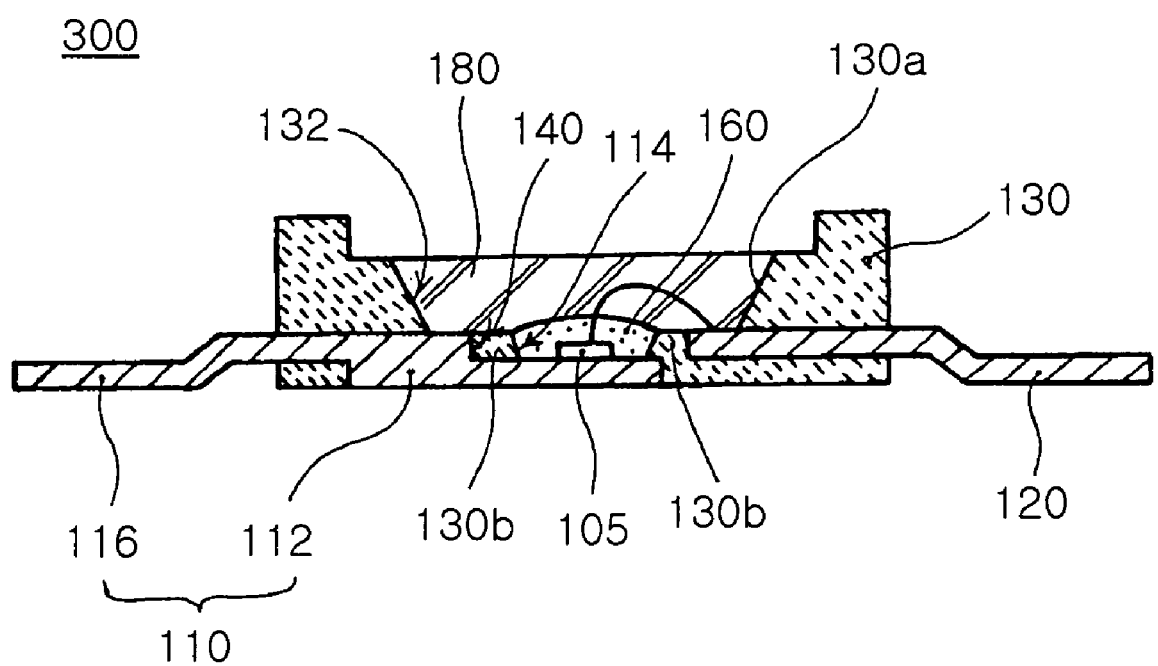
FIG. 8 is a cross-sectional view illustrating an LED package according to still another embodiment of the present invention, cut along the line AA'.

FIG. 8 is a cross-sectional view illustrating an LED package according to still another embodiment of the present invention, cut along the line AA', which corresponds to FIG. 4. Referring to FIG. 8, the heat transfer unit 112 may be formed of a single structure of a sheet metal consecutively extended in a thickness direction instead of being formed by folding or laminating a sheet metal. The groove 140 is formed on the heat transfer unit 112 formed in the single structure by step forming. Accordingly, there are different thicknesses of the sheet metal in an inner area and outer area of the groove 140 of the heat transfer unit 112. An incised portion of the groove 140, corresponding to the incised portion 141 of the top 112a, may be formed. Other elements and functions thereof are as described above.

Hereinafter, a process of manufacturing an LED package according to an exemplary embodiment of the present invention will be described. FIGS. FIGS. 10A to 11B are top views illustrating operations of a process of manufacturing an LED package, according to an exemplary embodiment of the present invention, and FIGS. 12A to 12G are cross-sectional views illustrating the operations of the process of manufacturing an LED package.

Figure 10A:
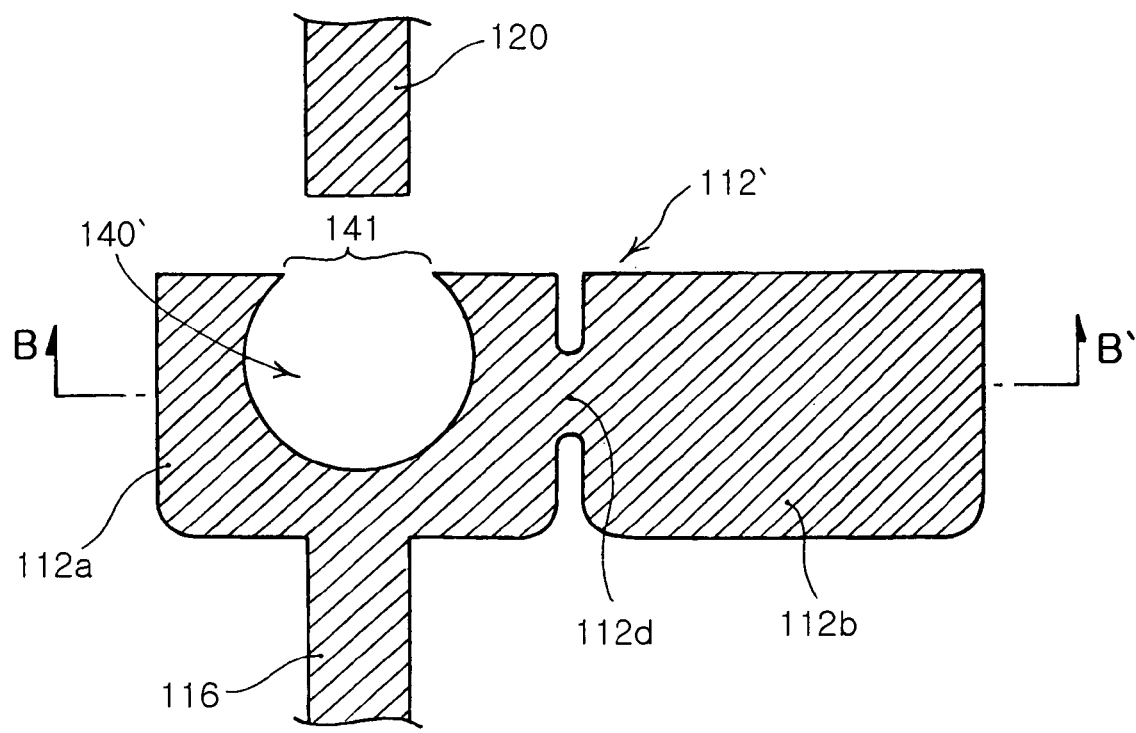
FIGS. 10A to 11B are top views illustrating operations of a process of manufacturing an LED package, according to an exemplary embodiment of the present invention.
Figure 10B:
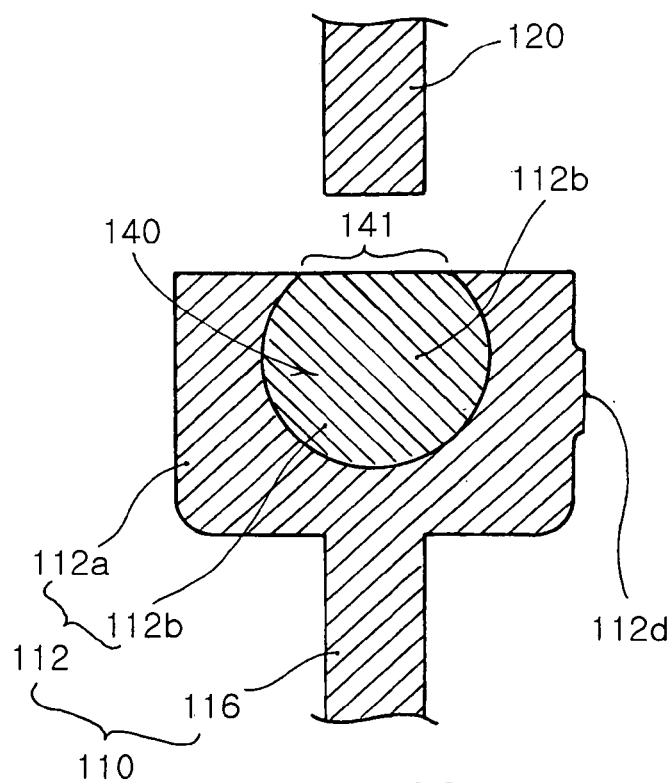
Figure 12A:
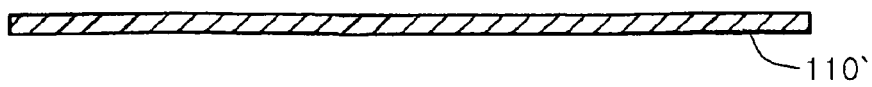
FIGS. 12A to 12G are cross-sectional views illustrating the operations of the process of manufacturing an LED package.
Figure 12B:
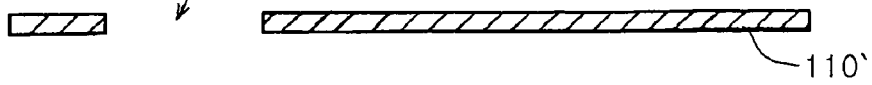
Figure 12C:
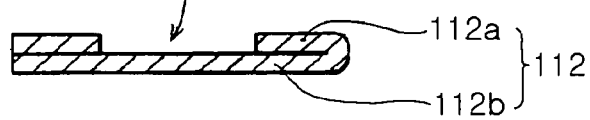

As shown in FIG. 10A, sheet metals 112' and 120 are prepared. The sheet metal 112' includes two sheet metals 112a and 112b, a connection portion 112d thereof, an extended portion 116 to be an external terminal, extended toward the sheet metal 112a. To obtain the sheet metal 112' in a shape shown in FIG. 10A, one sheet is prepared (FIG. 12A) and required shapes such as a hole 140' and an incised portion 141 are formed on the sheet metal 112a by punching (FIG. 12B). Accordingly, the sheet metal 112a is formed in the shape of a ring. Then, as shown in FIG. 10B, based on the connection portion 112d, the sheet metal 112' is folded to overlap each other and surfaces facing each other are mutually bonded by soldering or welding (FIG. 12C), thereby obtaining the first lead frame 110 having the heat transfer unit 112.

Figure 11A:
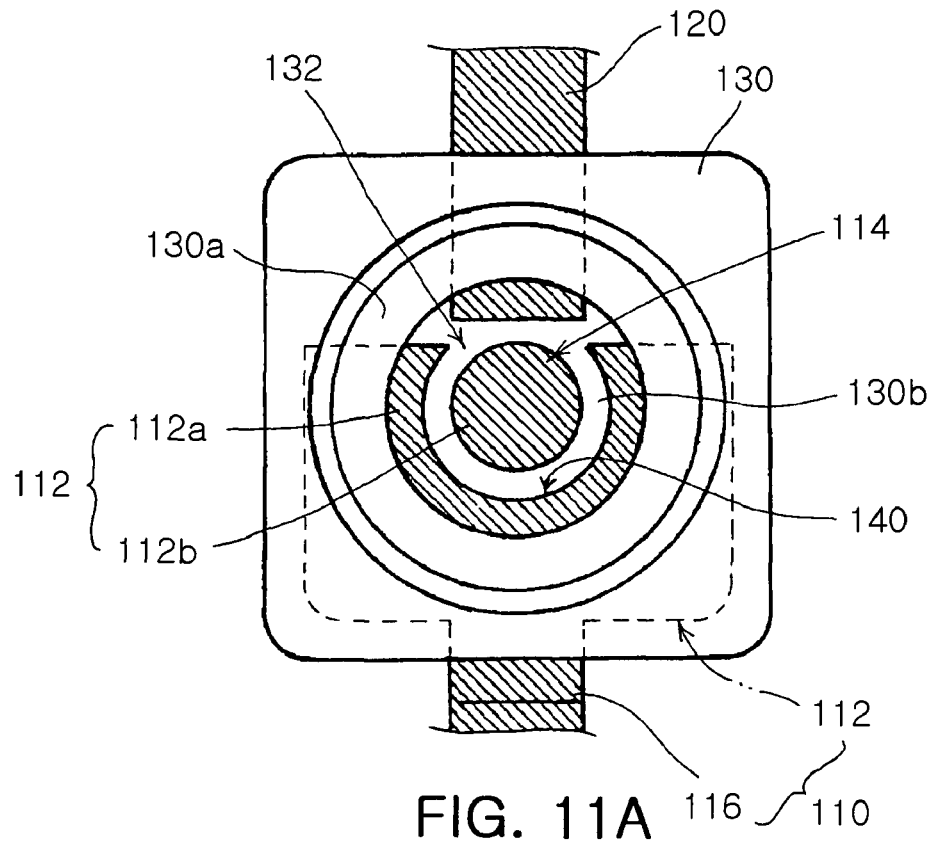
Figure 12D:
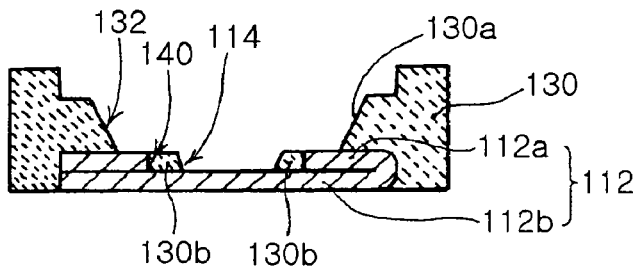
Figure 12E:
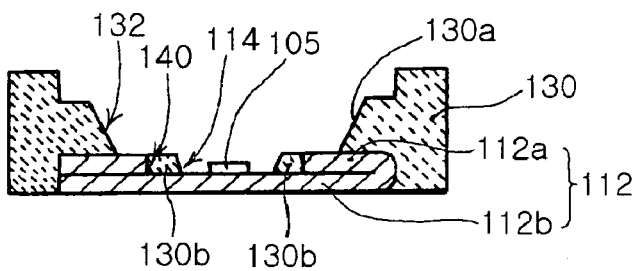

As shown in FIG. 11A, the second lead frame 120 is disposed opposite to the first lead frame 110 with a predetermined interval, and the package body 130 where the lead frames 110 and 120 are inserted by insertion molding or injection molding is formed (FIG. 12D). In this case, by the concave portion 132 of the package body 130, portions of the top and bottom 112a and 112b of the heat transfer unit 112 and the second lead frame 120 are exposed. Also, the ring-shaped portion 130b is formed in the inner wall of the groove 140 of the heat transfer unit 112, and the ring-shaped portion 130b has the aperture 114 exposing the bottom 112b for stably mounting the LED chip 105.

Figure 11B:
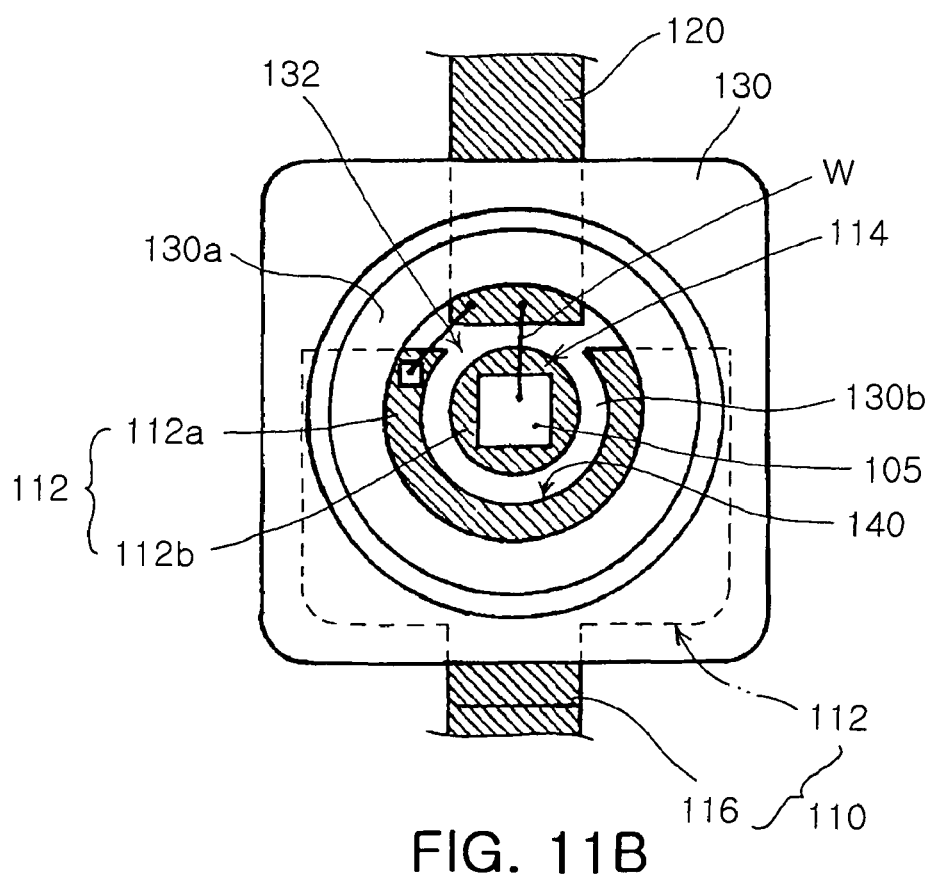
Figure 12F:
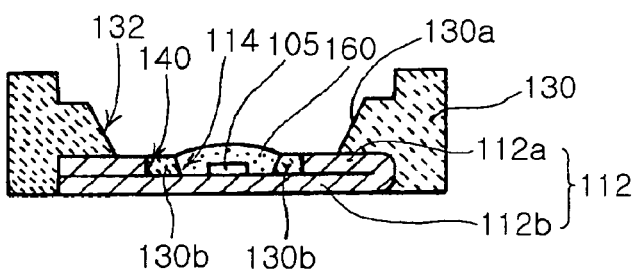
Figure 12G:
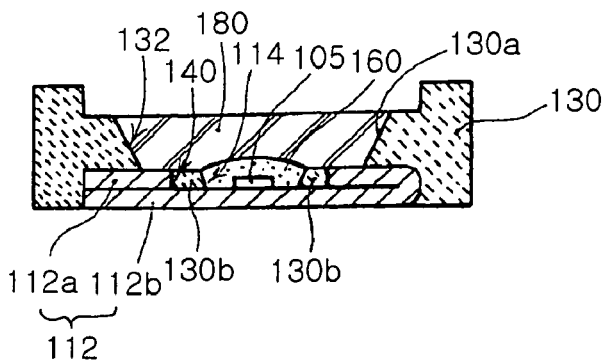

As shown in FIG. 11B, the LED chip 105 is mounted on the aperture 114 of the ring-shaped portion 130b, and bonding wires W required for an electric connection is formed (FIG. 12E) According to requirements, a Zener diode may be mounted on an outer side of the ring-shaped portion 130b. The phosphor layer 160 coating the LED chip 105 is formed on the aperture 114 of the ring-shaped portion 130b (FIG. 12F). To cover the phosphor layer 160, the light-transmitting encapsulation portion 180 is formed on the concave portion 132 of the package body 130 (FIG. 12G). The light-transmitting encapsulation portion 180 may be formed of a light-transmitting resin containing one or more of phosphors and a light scattering material.

FIGS. 13 to 17 are cross-sectional views illustrating LED packages according to various embodiments of the present invention.

Figure 13:
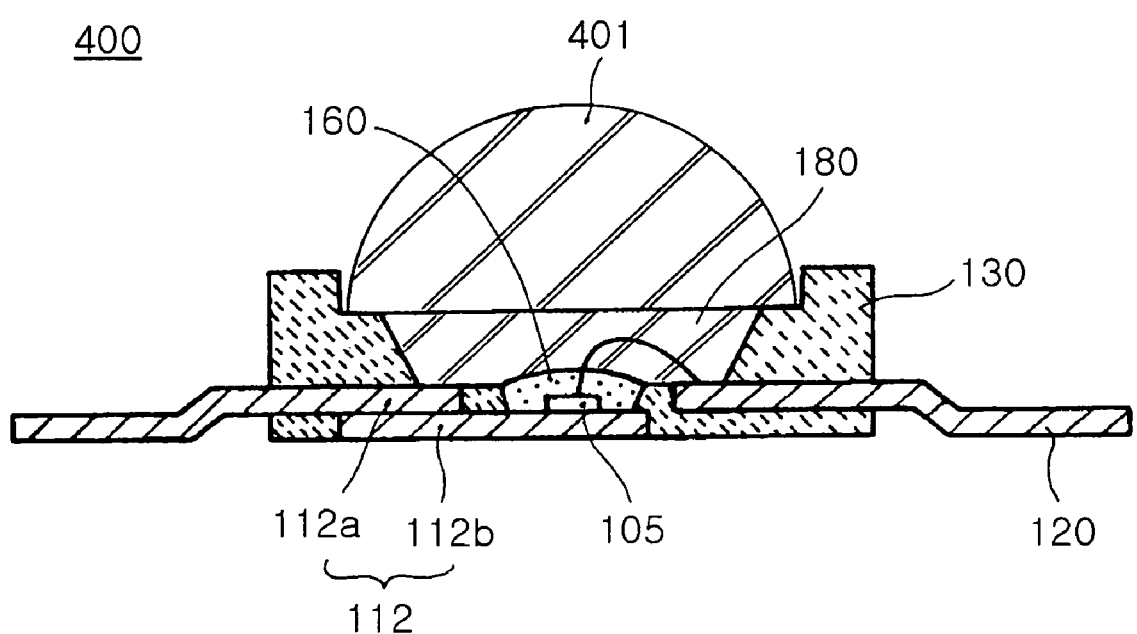
FIGS. 13 to 17 are cross-sectional views illustrating LED packages according to embodiments of the present invention.

Referring to FIG. 13, an LED package 400 may include an additional lens 401 mounted on the light-transmitting encapsulation portion 180. The lens 401 may have various shapes such as a hemisphere, a dome, and an oval. As a material of the lens 401, there are used a light-transmitting polymer or resin such as a polycarbonate, a polymethylmethacrylate (PMMA), a silicone resin and an epoxy resin. The lens 401 maybe filled with a color conversion material such as a light scattering material and phosphors.

Figure 14:
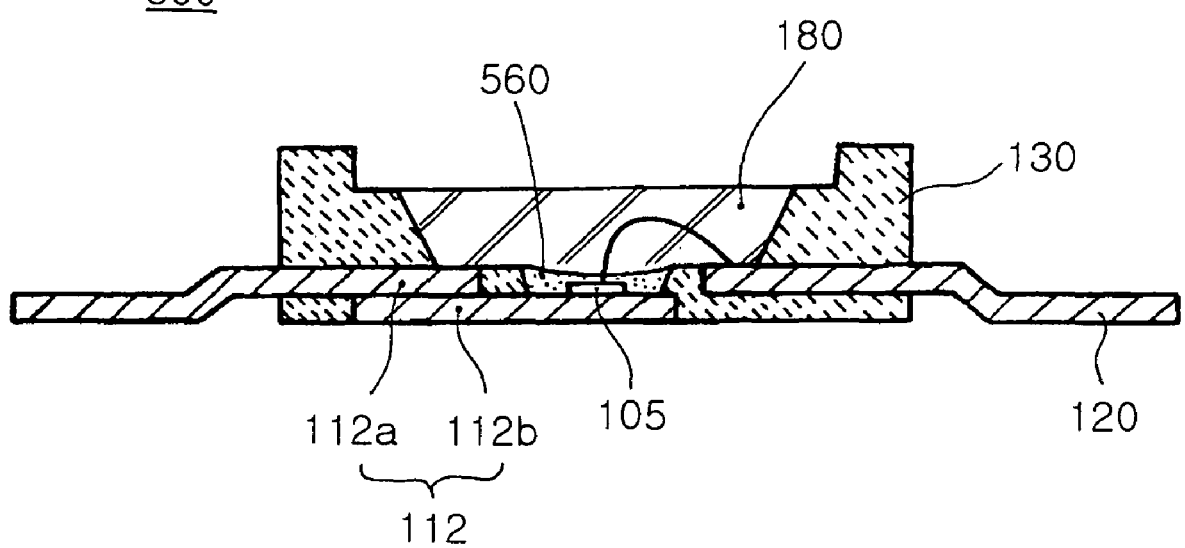

Referring to FIG. 14, in an LED package 500, a top surface of a phosphor layer 560 may have a profile of a concave lens. When the top surface of the phosphor layer 560 has the profile of the concave lens, a height of the top surface (a minimum height) of the phosphor layer 560 may be from 0.1 to 0.3 mm from a top surface of the LED chip 105. With respect to this, when the top surface of the phosphor layer 560 has a profile of a convex lens (refer to FIG. 4), a height of the top surface of the phosphor layer 160 (a maximum height) may be from 0.2 to 0.8 mm from the top surface of the LED chip 105.

Figure 15:
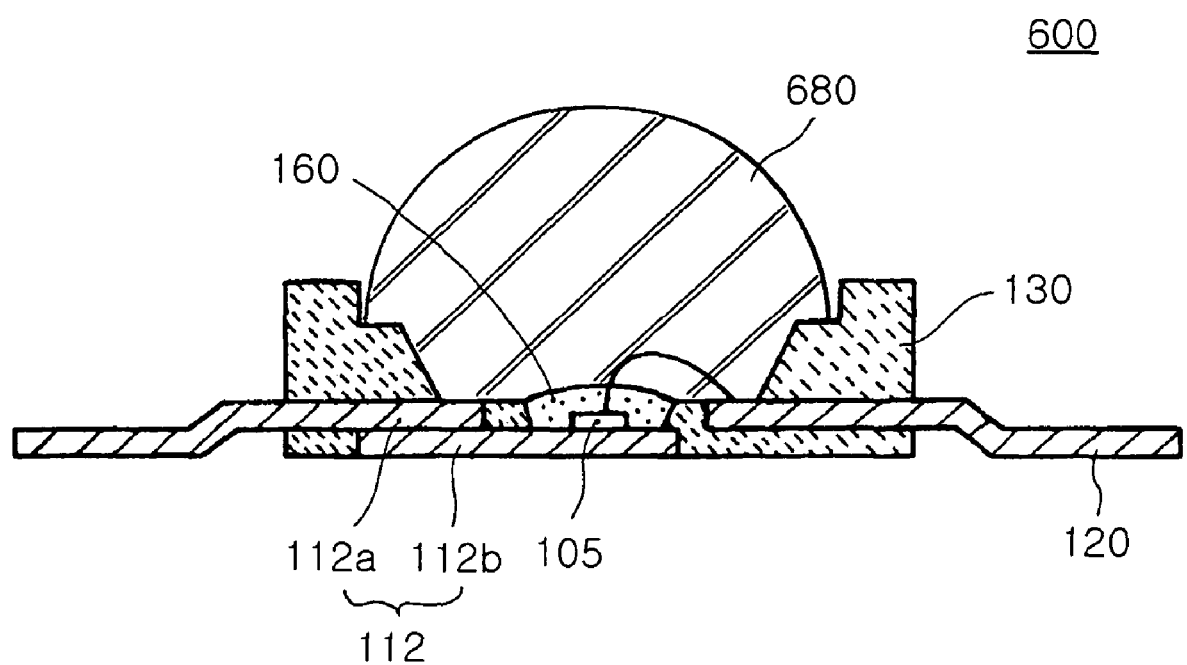

Referring to FIG. 15, in an LED package 600, a light-transmitting encapsulation portion 680 itself has a lens shape. This corresponds to that the light-transmitting encapsulation portion 180 are perfectly integrated to the lens 401 of an identical material. The light-transmitting encapsulation portion 680 may be filled with one or more of a light scattering material and phosphors.

Figure 16:
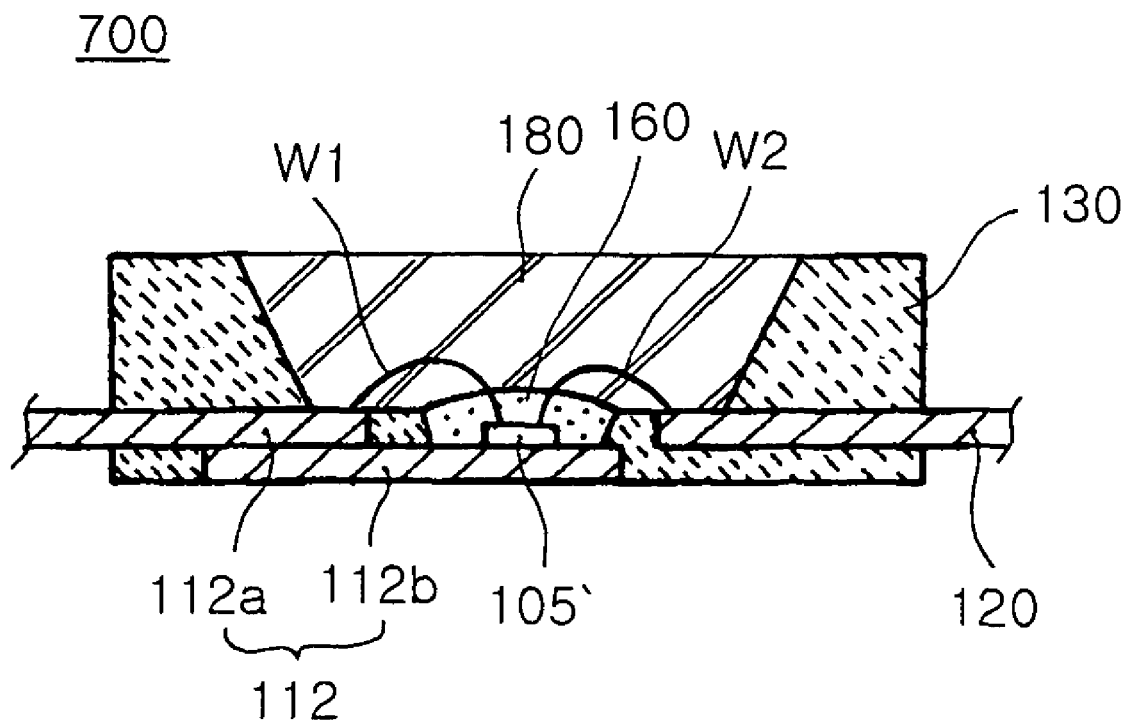

Referring to FIG. 16, in an LED package 700, the LED chip 105 is connected to lead frames having a different polarity from each other by two bonding wires W1 and W2. For example, an n-electrode and a p-electrode (not shown) formed on a top surface of the LED chip 105 having a vertical structure may be connected to the heat transfer unit 112 of the first lead frame 110 and the second lead frame 120 by the two bonding wires W1 and W2, respectively.

Figure 17:
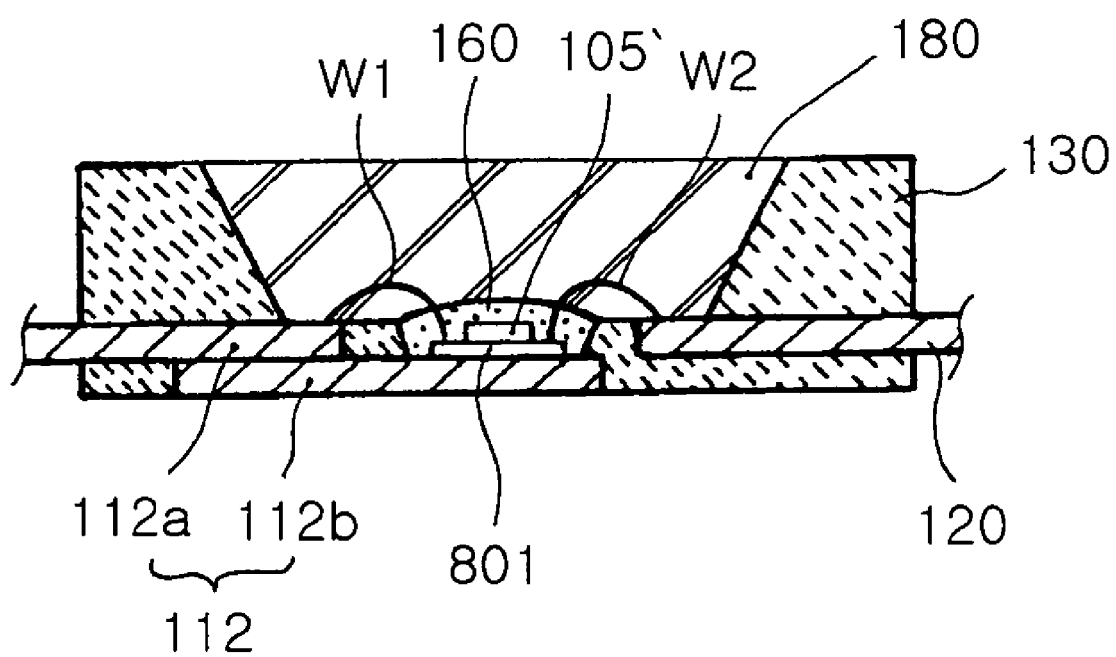

Referring to FIG. 17, an additional submount 801 is interposed between an LED chip 105' and the top 112a of the heat transfer unit 112. An electrode pattern is formed on the submount 801 and electrically connected to the LED chip 105' that is a flip chip bonded to the electrode pattern. Electrode patterns (not shown) on both ends of the submount 801 may be electrically connected to connection portions of the lead frames of corresponding polarities via the bonding wires W1 and W2. The submount 801 maybe formed of a silicone semiconductor.

As described above, according to an exemplary embodiment of the present invention, there is provided an LED package with high color uniformity according to far-field beam distribution, less light loss, and excellent heat emission characteristics. Also, a profile of a phosphor layer is formed of a lens, thereby adjusting light intensity and far-field beam distribution.

While the present invention has been shown and described in connection with the exemplary embodiments, it will be apparent to those skilled in the art that modifications and variations can be made without departing from the spirit and scope of the invention as defined by the appended claims.

What is claimed is:
1. A light emitting diode (LED) package comprising:
   an LED chip;
   a first lead frame having a heat transfer unit having an upper portion and a lower portion stepped downwardly from the upper portion;
   a second lead frame disposed separately from the first lead frame;
   a package body having a concave portion encapsulating a portion of the heat transfer unit and the second lead frame but exposing a portion of the top of the heat transfer unit and a portion of the second lead frame, and a ring-shaped portion extended along respective side walls of the upper portion of the heat transfer unit and the second lead frame, the ring-shaped portion being a portion of the package body; and
   a phosphor layer formed on the aperture of the ring-shaped portion and applied to the LED chip, wherein the LED chip is disposed in the inside of the aperture of the ring-shape portion and on the lower portion of the heat transfer unit.

2. The LED package of claim 1, wherein the heat transfer unit is formed by folding a sheet metal two or more times, and the top of the sheet metal has a hole to form the lower portion of the heat transfer unit.

3. The LED package of claim 2, wherein the top of the folded sheet metal has a ring-shape since an incised portion connected to the hole is formed thereon.

4. The LED package of claim 1, wherein the heat transfer unit is formed of a sheet metal lamination body where two or more sheet metals are laminated, and
an uppermost sheet metal of the sheet metal lamination body has a hole to form the lower portion of the heat transfer unit.

5. The LED package of claim 4, wherein the uppermost sheet metal has a ring shape since an incised portion connected to the hole is formed thereon.

6. The LED package of claim 1, wherein the heat transfer unit is formed of a single structure of a sheet metal consecutively extended in a thickness direction, and
the sheet metal has different thicknesses in the upper portion and the lower portion of the heat transfer unit.

7. The LED package of claim 1, wherein at least portion of a bottom of the heat transfer unit is exposed from a bottom of the package body.

8. The LED package of claim 1, wherein an inner wall of the ring-shaped portion is slant in such a way that the aperture has a top broader than a bottom thereof.

9. The LED package of claim 1, wherein a height of the aperture of the ring-shaped portion is 0.1 to 0.7 mm, and
a horizontal distance between the inner wall of the ring-shaped portion and the LED chip is from 0.2 to 0.5 mm.

10. The LED package of claim 1, further comprising a light-transmitting encapsulation portion formed in the concave portion of the package body and covering a top surface of the phosphor layer.

11. The LED package of claim 10, wherein the light-transmitting encapsulation portion contains a light diffuser.

12. The LED package of claim 10, wherein the light-transmitting encapsulation portion contains phosphors.

13. The LED package of claim 10, further comprising a lens mounted on the light-transmitting encapsulation portion.

14. The LED package of claim 10, wherein the light-transmitting encapsulation portion is formed in the shape of a lens.

15. The LED package of claim 1, wherein the top surface of the phosphor layer has a shape of one of a convex lens and a concave lens.

16. The LED package of claim 1, further comprising:
a submount mounted on a bottom of the lower portion and having electrode patterns,
wherein the LED chip is mounted on the submount and electrically connected to the electrode patterns, and
the electrode patterns of the submount are electrically connected to the lead frame by bonding wires.

17. The LED package of claim 1, wherein a hole for indicating a polarity is formed on one of external terminals of the first and second lead frames exposed from the package body.

* * * * *